United States Patent
Caggioni et al.

(10) Patent No.: US 8,205,141 B2
(45) Date of Patent: Jun. 19, 2012

(54) VIRTUAL LANE FORWARD ERROR CORRECTION IN MULTILANE DISTRIBUTION

(75) Inventors: Francesco Caggioni, Winchester, MA (US); Tracy Xiaoming Ma, Westford, MA (US)

(73) Assignee: Applied Micro Circuits Corporation, San Diego, CA (US)

( * ) Notice: Subject to any disclaimer, the term of this patent is extended or adjusted under 35 U.S.C. 154(b) by 721 days.

(21) Appl. No.: 12/431,970

(22) Filed: Apr. 29, 2009

(65) Prior Publication Data

US 2010/0281343 A1    Nov. 4, 2010

(51) Int. Cl.
    *G06F 11/00* (2006.01)
(52) U.S. Cl. .................................. 714/776; 714/752
(58) Field of Classification Search .................. 714/776, 714/752, 755, 772, 774, 786, 793; 370/445
    See application file for complete search history.

(56) References Cited

U.S. PATENT DOCUMENTS

| | | | |
|---|---|---|---|
| 7,362,779 B1 | 4/2008 | Zabezhinsky | |
| 2009/0129456 A1* | 5/2009 | Miyatani | 375/232 |
| 2010/0091909 A1* | 4/2010 | Ericson et al. | 375/329 |
| 2010/0215060 A1* | 8/2010 | Haas | 370/509 |
| 2010/0229067 A1* | 9/2010 | Ganga et al. | 714/752 |
| 2010/0232786 A1* | 9/2010 | Aoki et al. | 398/19 |

* cited by examiner

*Primary Examiner* — Dieu-Minh Le
(74) *Attorney, Agent, or Firm* — Law Office of Gerald Maliszewski; Gerald Maliszewski

(57) ABSTRACT

A system and method are provided for generating virtual lane (VL) forward error correction (FEC) overhead (OH) in a communication multi-lane distribution (MLD) protocol transmitter, and for recovering data words from virtual lanes with FEC OH in an MLD protocol receiver. The transmission method accepts an Optical Transport Network (OTN) frame with n consecutively ordered payload chunks of data words, at a first data rate. Each payload chunk is assigned to a virtual lane data word (VLDW) in an MLD frame of n consecutively ordered VLDWs. The assignment order of payload chunks to VLDWs is rotated at the start of each MLD frame. VLDWs are joined into VLDW groups, where each VLDW group includes at least one VLDW. FEC blocks are calculated for VLDWs, creating ordered VL codewords (VLCWs). Then, the VLCWs are multiplexed to maintain a consistent assignment of VLCW order to physical transmission lanes and transmitted.

22 Claims, 9 Drawing Sheets

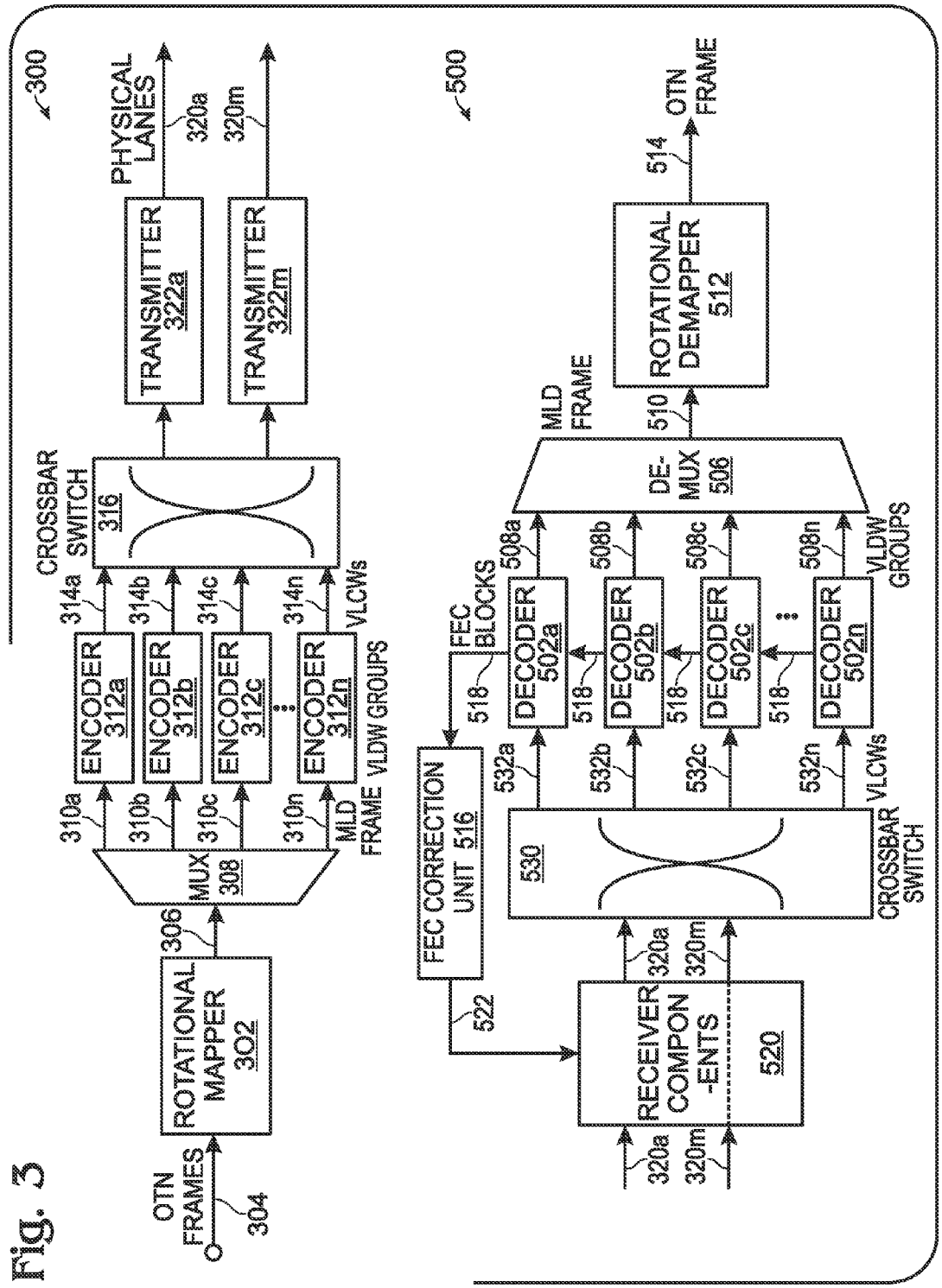

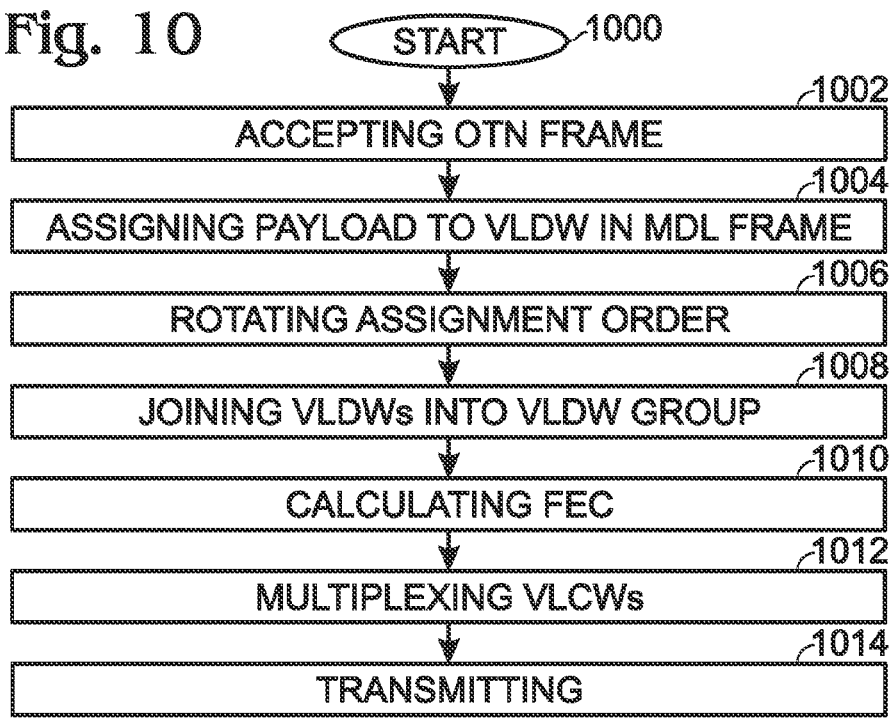
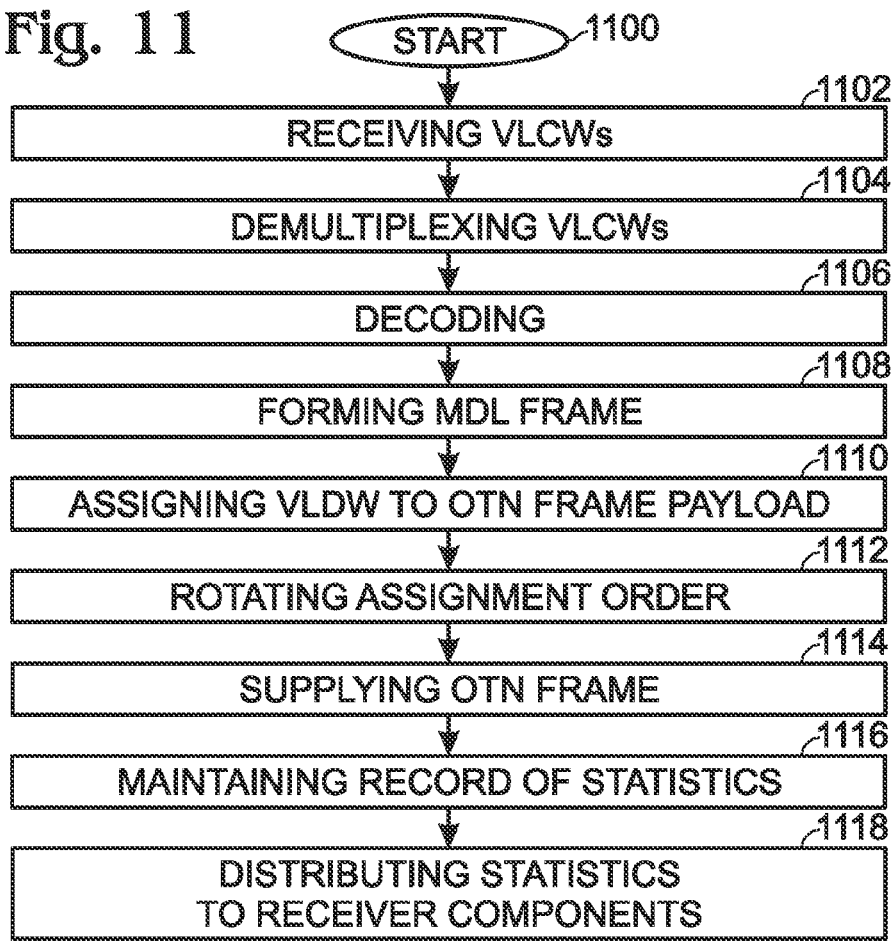

VIRTUAL LANE FORWARD ERROR CORRECTION IN MULTILANE DISTRIBUTION

BACKGROUND OF THE INVENTION

1. Field of the Invention

This invention generally relates to communication protocol and, more particularly, to a system and method for maintaining virtual lane forward error correction (FEC) in a multilane network.

2. Description of the Related Art

Conventionally, both optical and electrical communications have been carried a single communication channel. The Multi-lane Distribution (MLD) protocol, as specified by both the IEEE and ITU, is meant to allow a stream of serial traffic to be transmitted over distinct parallel channels. MLD protocol takes a serial stream and breaks it in smaller blocks. These blocks are then assigned a Lane or virtual lane number. Each virtual lane has the characteristic that a periodic pattern is uniquely present on each lane. The pattern is periodic and the time shift between lane markers is deterministic. These characteristics make it possible to reconstruct the original serial sequence at a receiver after these signals have traveled over different media, such as fiber, copper, or lambdas.

The number of virtual lanes into which a serial stream is broken depends on the set of parallel media over which the signals are transported. If a signal can be transported over 10, 5, 4, 2 or 1 media, 20 VL are required to always accommodate the same number of virtual lanes on each medium. For example, in the case where there are 4 media (physically separated channels) and 20 VLs, then 5 VLs travel over the same media at any given time, single bit interleaved or x-bit interleaved.

One of the properties of the MLD interface is that once a VL is assigned to a media, it will travel over the same media for the reminder of the communication. Therefore, once the receiver is able to synchronize over the multiple virtual lanes being transported on each channel, the receiver is able to reconstruct the original serial stream.

However, one problem does arise when adapting the MLD protocol to Optical Transport Network (OTN) communications over multiple media. FEC in communication systems is intended to correct errors occurring in a particular channel. Conventionally, the payload portion of the signal and the parity portion of the signal (FEC) have shared the same medium in OTN networks. Since the FEC and payload share the same medium, the performance monitoring parameters, such as corrected 0s and corrected 1s from the FEC decoder, have been used to send feedback to the receiver and equalizer to correct the thresholds of the incoming signal.

However, in parallel communication systems there are multiple receivers and, therefore, each receiver can use different parameters to interpret the received signal. Some example of parallel communication systems include: Wavelength Division Multiplexing (WDM), Polarization Multiplexing, x-QAM, and x-PSK modulation. The OTN FEC interleaving schemes currently specified in G.709 and in the appendix of G.975.1, when combined with MLD, break the linkage between a channel and the FEC information needed to correct that channel. Since FEC and payload are no longer associated with the same transmitter and receiver, it is no longer possible to correlate the decoder FEC performance monitoring parameters with a particular transmission channel.

The lack of correlation between error rate and pre-FEC decoder error rate renders it impossible to tweak the equalization parameters, the receiver thresholds, and the CDC (chromatic dispersion compensators) parameters, as is conventionally done for single-channel systems.

FIG. 1 a diagram depicting an OTU3 (43 gigabit per second (43 Gbs)) MLD interface using 4 Virtual Lanes (VLs) (prior art).

FIG. 2 a diagram depicting an OTU4 (100 gigabit Ethernet—100 GbE) MLD interface using 20 VLs (prior art). The ITU calls for a VL rotation on a per frame basis, as shown. The basic concept for performing the striping in FIGS. 1 and 2 is as follows:

Stripe in 16 byte blocks starting with bytes 1 to 16 of the frame;

Rotate the order of the mapping from the OTN frame to the VLs at each OTN frame boundary, so that the existing frame alignment signal appears on each lane successively;

For OTU3, the MFAS from every fourth frame appears in each lane so this can be used as lane ID;

Overwrite the last A-2 byte for STM-256 or the last OA2 byte for OTU4 with lane ID;

If a new frame counter field is created for OTU4 which is always present and which repeats over a multiple of 20 frames, use this as the lane ID.

The above-described scheme results in a set of parallel signals, each of which will have a marker every 4080*4 bytes. Each signal marker has a common portion FAS that can be used for alignment purpose and a unique portion that can be used to identify each virtual lane. Additional details of this striping scheme can be found in U.S. Pat. No. 7,362,779, issued Apr. 22, 2008, entitled TRANSMISSION OF DATA FRAMES AS A PLURALITY OF SUBFRAMES OVER A PLURALITY OF CHANNELS, invented by Vladimir Zabezhinsky, which is incorporated herein by reference.

The conventional OTN row is defined as a structure with 3824 payload bytes and 256 FEC parity bytes, where 1 frame is equal to 4 rows. This creates a ratio of 239 (payload) to 16 (FEC). In the case where each VL block is 16 bytes, there are 239 blocks of payload and 16 blocks of FEC per row or 239*4 payload and 64 FEC. When 20 VLs are used, the number of VL blocks resident in the FEC area is not equal for all virtual lanes. Only over the combined sum of 20 OTN frames is it possible to find the same ratio of payload to FEC (239/16) in the VL blocks as in the single channel implementation.

One possible solution is to separately frame each VL, creating the same structure as a conventional OTN frame. However, the solution introduces significant latency—20 times the latency of the conventional OTN decoder. Conventionally, the OTN decoder delay for G.709 FEC is 1 OTN row, which would become 20 OTN rows using the above-proposed solution. Added latency not only increases overall signal delay, but also increases the memory requirements by 20-fold. Further, statistic would have to maintained on a per virtual lane basis, multiplying the complexity of the encoders and decoders.

One might try to solve the problem of latency by reducing the current interleaving specified in the FEC in order to shorten the latency and reduce the required memory. This creates a problem when there is a high level of parallelism (e.g., 10 lanes), as the signal becomes more susceptible to burst error when the number of interleaved codewords is reduced.

It would be advantageous if FEC corrections and virtual lanes could be properly correlated in an MLD OTN network, with a minimum of added latency and buffering requirements.

SUMMARY OF THE INVENTION

The invention described herein uses an interleaving scheme, deinterleaving scheme, a decoder feedback loop, and an initialization algorithm to provide a correlation between transceivers parameters and pre-FEC error statistics. Thus, an encoder and decoder are capable of maintaining the proper synchronization between payload and FEC information to provide correct feedback to individual receivers.

This invention is not tied to a particular FEC code, but rather, defines the distribution and processing of data on a medium. As a result, an FEC decoder can maintain a count of 0s and 1s corrected for each channel that is provided to the receiver and equalizer.

Accordingly, a method is provided for generating virtual lane (VL) forward error correction (FEC) overhead (OH) in a communication multi-lane distribution (MLD) protocol transmitter. The method accepts an energy waveform representing an Optical Transport Network (OTN) frame with n consecutively ordered payload chunks of data words, at a first data rate. Each payload chunk is assigned to a virtual lane data word (VLDW) in an MLD frame of n consecutively ordered VLDWs. The assignment order of payload chunks to VLDWs is rotated at the start of each MLD frame. VLDWs are joined into a VLDW groups, where each VLDW group includes at least one VLDW. FEC blocks are calculated for VLDWs, creating ordered VL codewords (VLCWs), where each VLCW is associated with a corresponding encoder. That is, each VLCW order is associated with a particular encoder. Then, the VLCWs are multiplexed to maintain a consistent assignment of VLCW order to physical transmission lane, and each VLCW is transmitted in parallel via the physical transmission lanes at a combined first data rate. Each VLCW has the same ratio of data word bytes to FEC block bytes, and each physical transmission lane transmits the same ratio of data word bytes to FEC block bytes.

In another aspect, a method is provided for recovering data words from virtual lanes with FEC OH in a communication MLD protocol receiver. The method receives energy waveforms representing a plurality of ordered VLCWs in parallel at a combined first data rate, via a plurality of physical transmission lanes. Each VLCW order is consistently assigned to a physical transmission lane. The VLCWs are demultiplexed by order and decoded into VLDW groups and associated FEC blocks. An MLD frame of n consecutively ordered VLDWs is formed. Then, each VLDW is assigned to a payload chunk of data words in an OTN frame of consecutively ordered payload chunks. The assignment order of VLDWs to payload chunks is rotated at the start of each OTN frame, and an energy waveform representing the OTN frame is supplied at the first data rate.

Additional details of the above-described methods, an MLD transmitter, and an MLD receiver are provided below.

BRIEF DESCRIPTION OF THE DRAWINGS

FIG. 3 is a schematic block diagram depicting a multi-lane distribution (MLD) protocol transmitter with a system for generating virtual lane (VL) forward error correction (FEC) overhead (OH).

FIG. 10 is a flowchart illustrating a method for generating VL FEC OH in a communication MLD protocol transmitter.

FIG. 11 is a flowchart illustrating a method for recovering data words from virtual lanes with FEC OH in a communication MLD protocol receiver.

DETAILED DESCRIPTION

Figure 1:
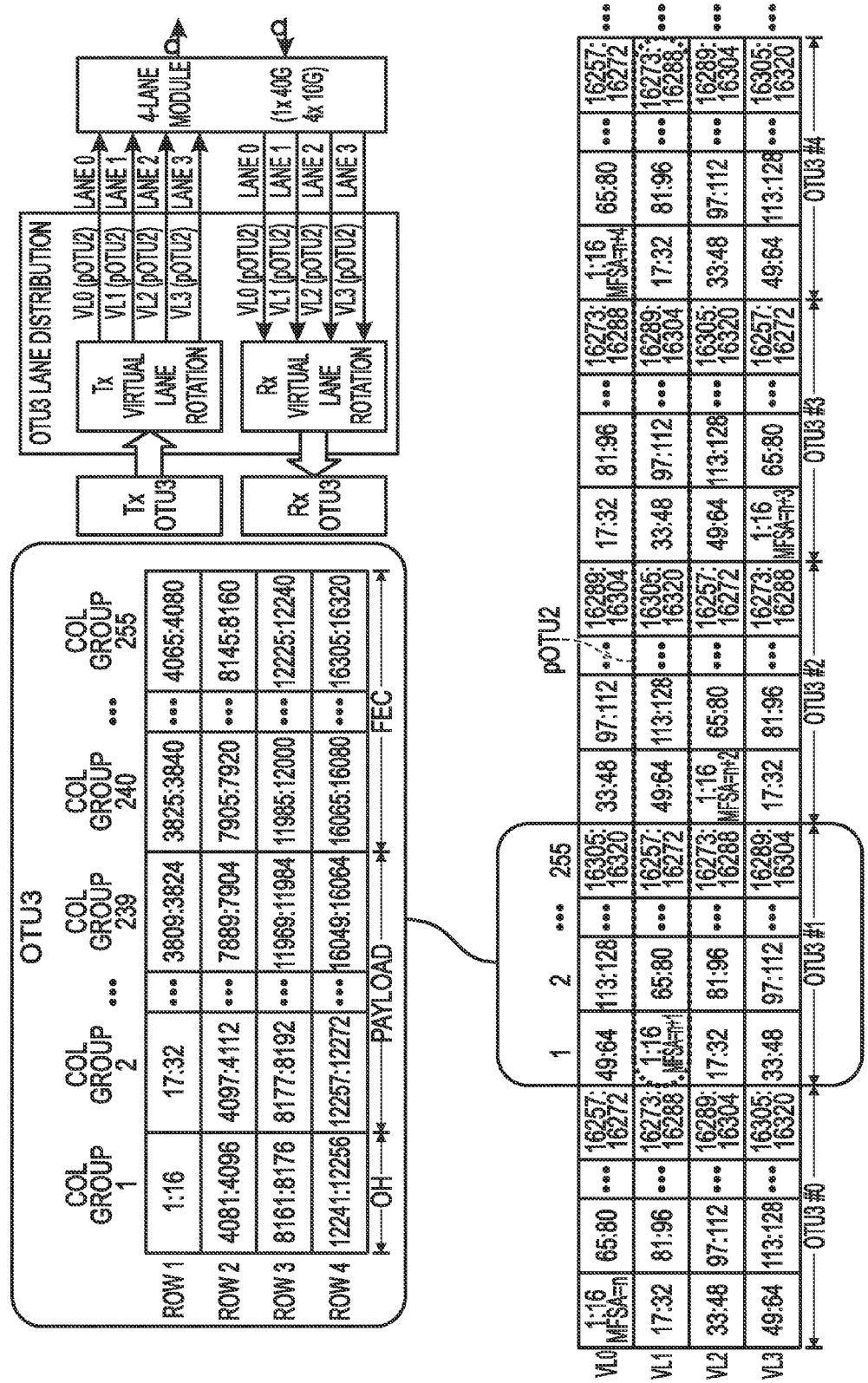
FIG. 1 a diagram depicting an OTU3 (43 gigabit per second (43 Gbs)) MLD interface using 4 Virtual Lanes (VLs) (prior art).
Figure 2:
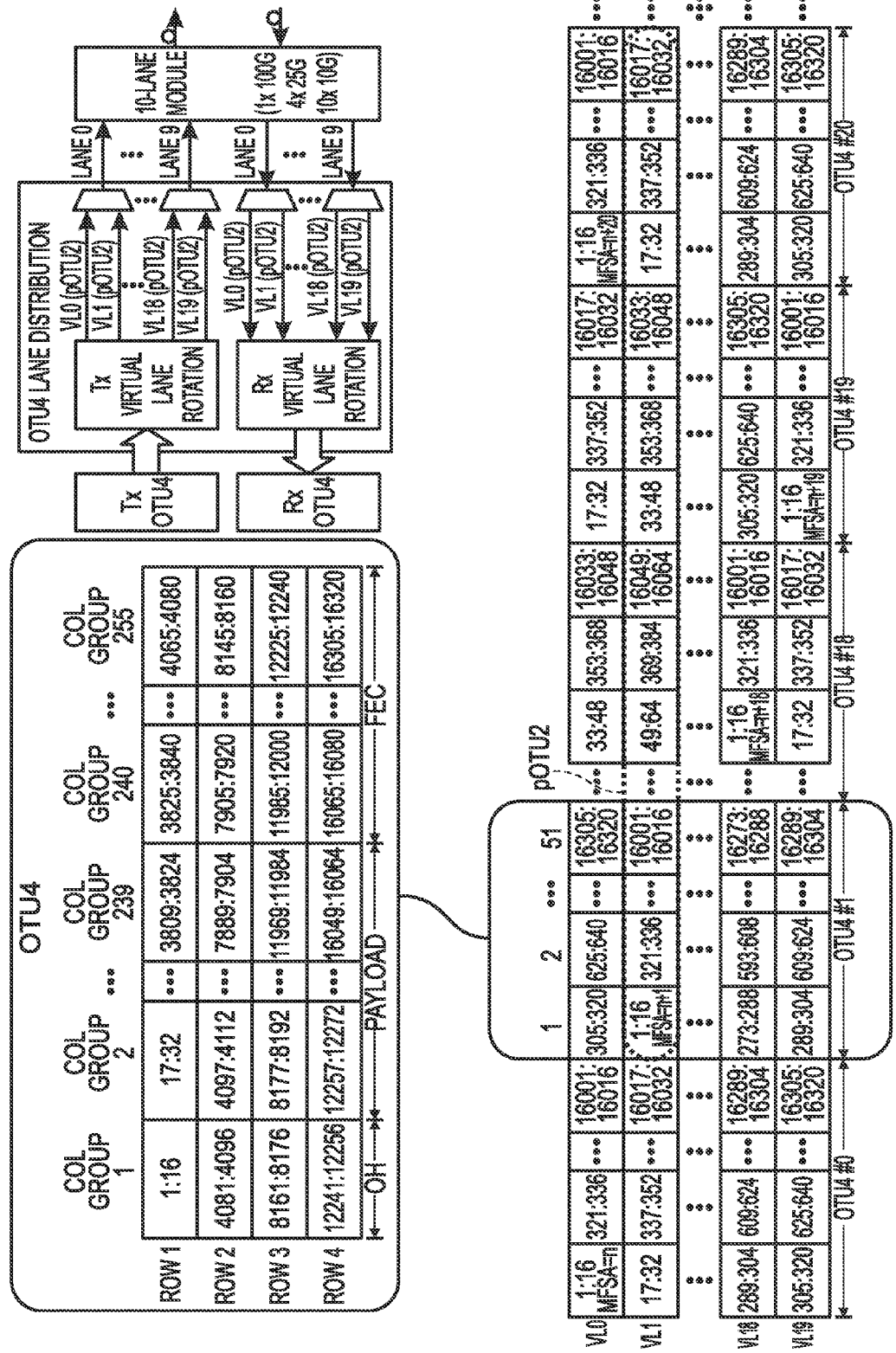
FIG. 2 a diagram depicting an OTU4 (100 gigabit Ethernet—100 GbE) MLD interface using 20 VLs (prior art).

FIG. 3 is a schematic block diagram depicting a multi-lane distribution (MLD) protocol transmitter with a system for generating virtual lane (VL) forward error correction (FEC) overhead (OH). The system 300 comprises a rotation mapper 302 having an interface on line 304 to accept an energy waveform representing an Optical Transport Network (OTN) frame with n consecutively ordered payload chunks of data words, at a first data rate. The mapper 302 assigns each payload chunk to a virtual lane data word (VLDW) in an MLD frame of n consecutively ordered VLDWs, and rotates the assignment order of payload chunks to VLDWs at the start of each MLD frame. The MLD frame is supplied on line 306. Specific examples of this assignment and rotation process are provided for OTU3 and OTU4 frames in FIGS. 1 and 2, respectively.

A multiplexer (MUX) 308 has an input on line 306 to accept the MLD frame and a plurality of outputs on line 310 to supply VLDW groups, where each VLDW group includes at least one VLDW. Outputs on lines 310a through 310n are shown where n is a variable not limited to any particular value. A plurality of encoders 312 has inputs connected to the MUX 308 on line 310 to accept the VLDW groups. Encoders 312a through 312n are shown. The encoders 312 calculate forward error correction (FEC) blocks for the VLDW groups, and join VLDW groups and their associated FEC blocks into ordered VL codewords (VLCWs). The VLCWs are ordered in the sense that each VLCW is associated with a corresponding encoder. For example, a first ordered VLCW is associated with a first encoder (312a).

A crossbar switch 316 has a plurality of inputs on lines 314a through 314n, connected to the encoder outputs. The crossbar switch 316 selectively connects the VLCWs to outputs to maintain a consistent assignment of VLCW order to physical transmission lanes 320a through 320m, where m is a variable. A plurality of transmitters, 322a through 322m is shown, one for each physical transmission lane 320. The plurality of transmitters transmits energy waveforms representing the VLCWs in parallel at a combined first data rate.

For example, the crossbar 316 insures that the first ordered VLCW associated with the first encoder 312a, is always assigned to physical transmission lane 320a. Of particular interest is the case where m is less than n. In this case it becomes possible to inconsistently assign VLCW order to physical lanes, unless crossbar 316 is used. For example, the crossbar switch 316 may have a first number of inputs connected to a first number of encoder outputs, and a second number of outputs connected to a second number of physical lanes, less than the first number. The encoders 312 create VLCWs each having the same ratio of data word bytes to FEC block bytes, and each transmitter transmits the same ratio of data word bytes to FEC block bytes.

Figure 12:
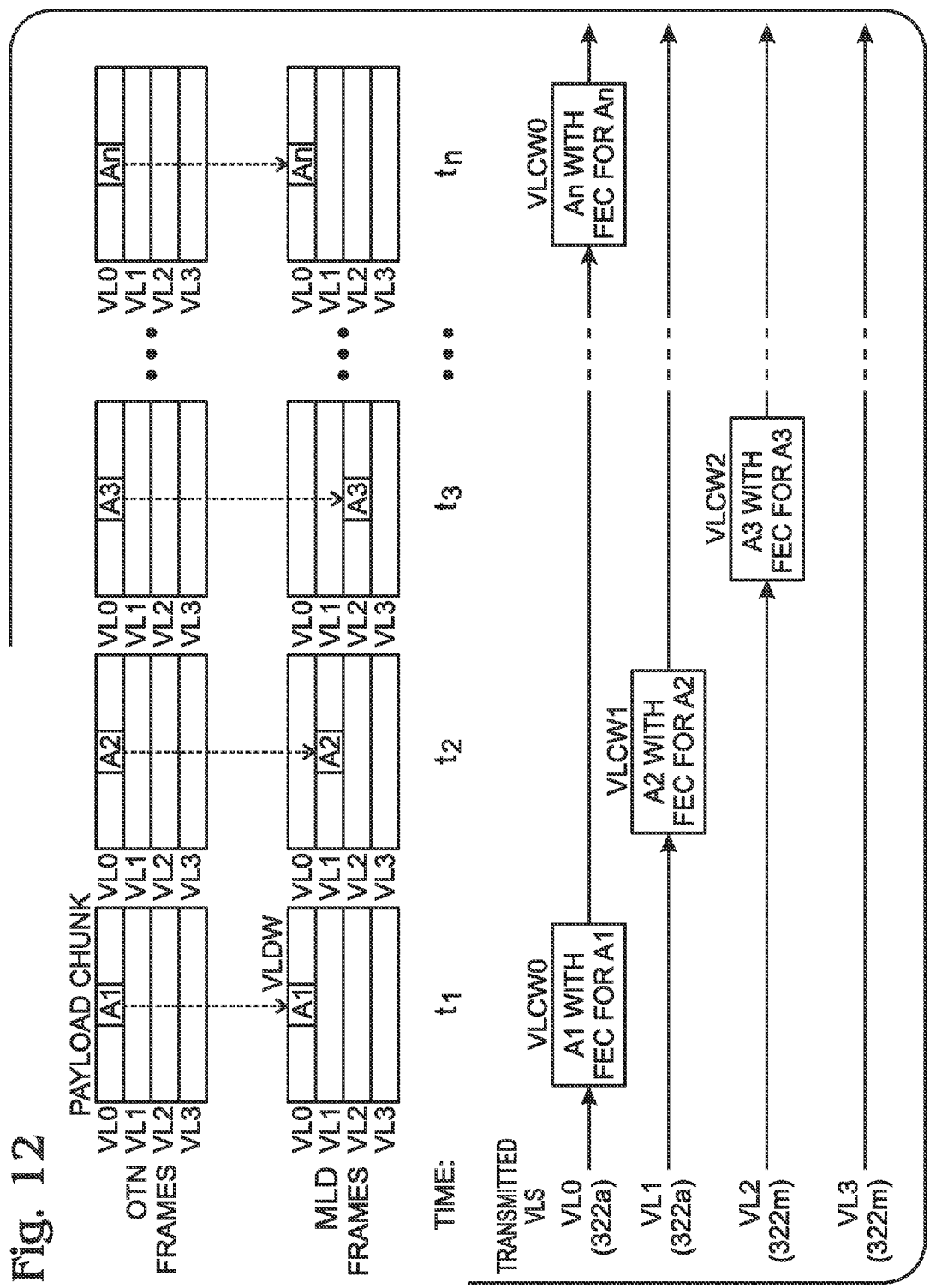
FIG. 12 is a diagram depicting the flow of payload chunks in an OTN frame to VLCWs in a transmitted VLCW.

FIG. 12 is a diagram depicting the flow of payload chunks in an OTN frame to VLCWs in a transmitted VLCW. At time t1, payload chunk A1 form an OTN frame is assigned as a VLDW to VL0 of an MLD frame. A1, and its associated FEC is encoded by encoder 312a (see FIG. 3), and transmitted. At time t2, payload chunk A2 is assigned as a VLDW to VL1 on an MLD frame. A2, and its associated FEC is encoded by encoder 312b (see FIG. 3) and transmitted. Some time later at tn, after cycling through all 4 VLs, payload chunk An is assigned as a VLDW to VL0. Note: payload chunks A1, A2, and An all occur at the same location in each OTN frame. Assuming that n=4 and m=2, VLCW0 and VLCW1 are transmitted via physical transmission lane 322a at times t1 and t2, respectively. At time t3, VLCW2 is transmitted via physical transmission line 322m.

Figure 4A:
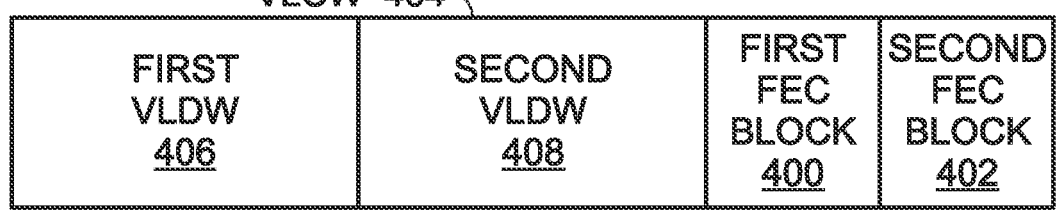
FIG. 4A and 4B depict details of a VLCW.
Figure 4B:
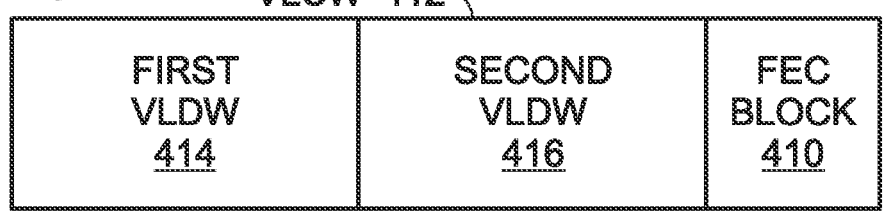

FIGS. 4A and 4B depict details of a VLCW. In FIG. 4A, an encoder calculates a first FEC block 400 and a second FEC block 402 for a VLCW 404 including a first VLDW 406 and a second VLDW 408. Note: there is no limit to the number of FEC blocks and corresponding VLDWs in a VLCW. In FIG. 4B an encoder calculates a single FEC block 410 for a VLCW 412 including a first VLDW 414 and a second VLDW 416. Again, there is no limit to the number of VLDWs that may be associated with a single FEC block.

Returning to FIG. 3, an MLD protocol receiver is depicted with a system for recovering data words from virtual lanes with FEC OH. The system 500 comprises a crossbar switch 530 has inputs connected to a plurality of physical transmission lane interfaces 320a through 32om for receiving energy waveforms representing a plurality of ordered VLCW in parallel at a combined first data rate. As noted above, each VLCW order is consistently assigned to a physical transmission lane. The crossbar switch 530 has a plurality of outputs on line 532a through 532n.

A plurality of decoders 502a through 502n have inputs connected to the crossbar switch outputs on line 532, where each decoder 502 is associated with a corresponding VLCW order. Each decoder 502 differentiates a VLCW into VLDW groups and associated FEC blocks, where each VLDW group includes at least one VLDW. A demultiplexer (DEMUX) 506 has a plurality of inputs on lines 508a through 508n to receive VLDWs from the decoders 502. The DEMUX 506 has an output on line 510 to supply an MLD frame of n consecutively ordered VLDWs A rotation demapper 512 has an input on line 510 to accept the MLD frame. The rotation demapper 512 assigns each VLDW to a payload chunk of data words in an OTN frame of consecutively ordered payload chunks. The demapper 512 rotates the assignment order of VLDWs to payload chunks at the start of each OTN frame, and supplies an energy waveform representing the OTN frame at the first data rate on line 514. Each decoder 502 differentiates VLCWs, each having the same ratio of data words bytes to FEC block bytes.

In one aspect, m<n. For example, the crossbar switch 530 may receive a first order VLCW and a second order VLCW via a first physical transmission lane 320a, and supply the first order VLCW to a first decoder 502a and the second order VLCW to a second decoder 502b.

Figure 5A:
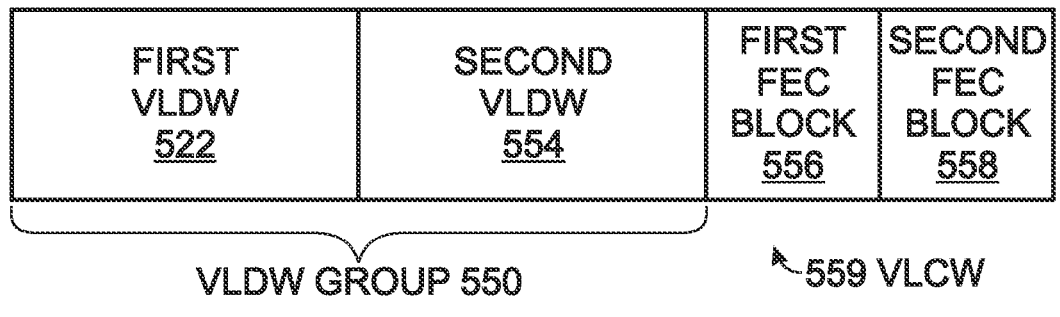
FIGS. 5A and 5B depict details of VLDW groups.
Figure 5B:
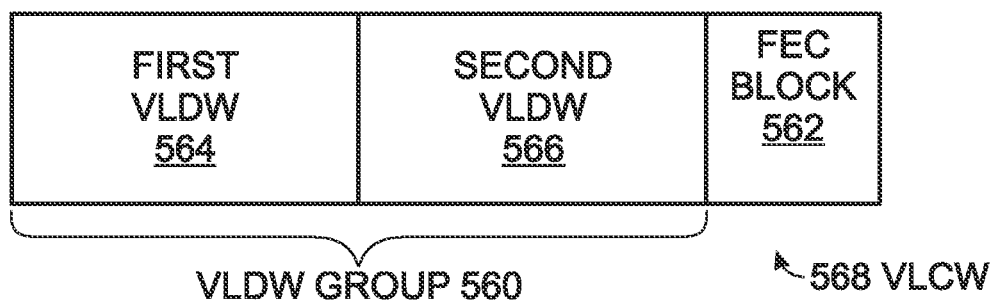

FIGS. 5A and 5B depict details of VLDW groups. In one aspect, a decoder differentiates a first VLDW group 550 into a first VLDW 552, a second VLDW 554. As part of the VLCW 559, a first FEC block 556 is associated with the first VLDW 552 and a second FEC block 558 is associated with the second VLDW 554. Note: a VLDW group is not limited to any particular number of VLDWs.

In FIG. 5B a decoder differentiates a VLDW group 560 into a first VLDW 564 and a second VLDW 566. As part of VLCW 568, a first FEC block 562 is associated with both the first VLDW 564 and the second VLDW 566. Again, there is no limit to the number of VLDWs that may be associated with a single FEC block.

Returning to FIG. 3, one aspect the system further comprises an FEC correction unit 516 having an input on line 518 to receive FEC blocks from the decoders 502a through 502n. The FEC correction unit 516 maintains a record of statistics associated with each ordered VLCW and distributes the statistics associated with the VLCWs to communication receiver components 520 on line 522. Note: statistics concerning the VLCWs relate back to the physical lanes. Examples of communication receiver components include equalizers, chromatic dispersion compensators, phase and amplitude thresholds, or other hardware components known in the art that would aid the decoders in recovering correct data. Alternately but not shown, each decoder and physical lane may have its own dedicated FEC correction unit.

For example, the receiver thresholds can be changed while observing the "0" and "1" errors prior to FEC decoding. By using these observations, an optimal parameter for these thresholds can be found between a setting where more 1s errors occur in a given time period, and a setting that generates more 0s errors. Note: adjustments to the receiver components 520 may, or may not affect the VLs equally.

The system depicted in FIG. 3 may be enabled exclusively in hardware using state machine and combinational logic. Alternately, portions of the systems may be enabled through the use of software instructions stored in a memory and executed by a processor.

Functional Description

As noted above, the systems depicted in FIG. 3 solve the problem of maintaining the correlation between the pre-FEC error statistics and the associated media without increasing latency, memory requirements, or the amount of statistics to be maintained, while maintaining acceptable burst error correction capability. In one aspect, the systems of FIG. 3 can be used to maintain the association between OTN payload bytes and the associated FEC parity bytes. Currently standardized and non-standardized FEC algorithms are unable handle VLs with properly correlated parity, since MLD causes the associations in each frame to change.

Figure 6:
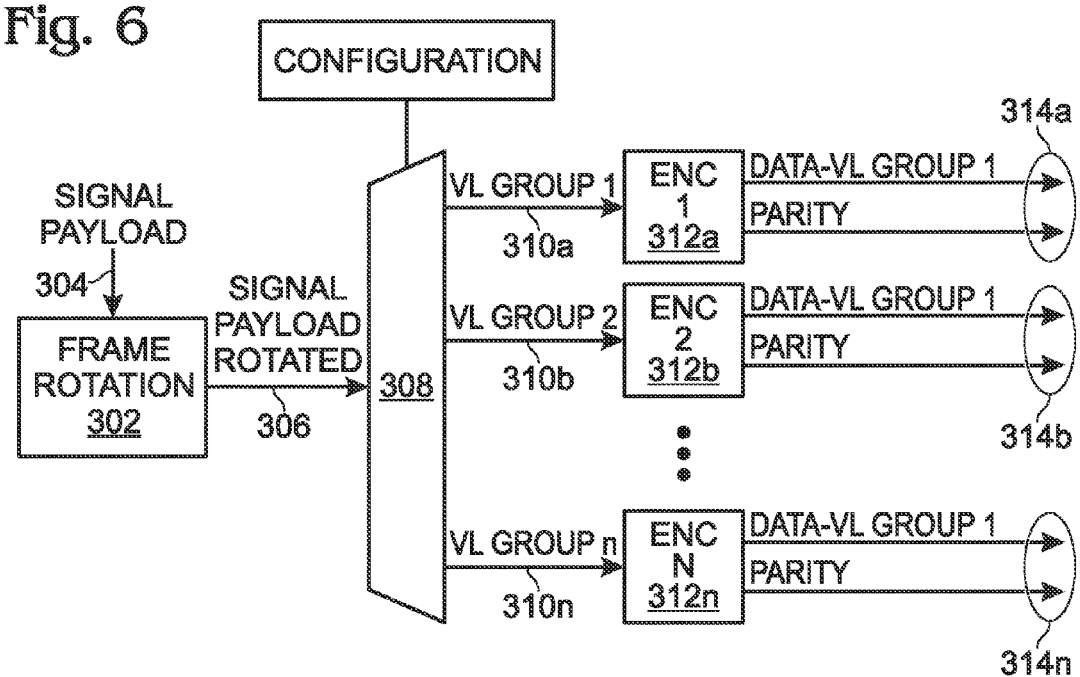
FIG. 6 is a schematic block diagram depicting a portion of the transmitter of FIG. 3 in greater detail.

FIG. 6 is a schematic block diagram depicting a portion of the transmitter of FIG. 3 in greater detail. The task of the encoder is to maintain a unique association between the payload associated with a specific virtual lane, or a set of virtual lanes, and a unique encoding engine. So, if there are 20 VLs and 20 encoding engines, the payload associated with each VL, which moves at the start of every frame, is always sent to one of the 20 encoding engines. The payload and FEC bytes at the output of the encoder will then be placed in the correct position in the frame before being sent for transmission.

If there are 20 VL and 4 encoding engines, the payload associated with a set of VLs (a VL group) is always be sent to the same encoding engine. The multiplexer in front of the encoding engines can be configured to map any group of VLs to any of the engines. Note: the number of VLs is the same for each engine. The configuration parameters for the mapping are stored in a configuration memory or statically configured.

This mechanism makes it possible to generate the parity from a given payload and make sure that the payload and parity remain associated to the same VL or the same group of VLs. Since a VL or a group of VLs travel over the same media for the duration of the communication, it is now possible to interleave the data in such a way that payload and associated FEC will always travel over the same media.

Each VL block is prepared for transmission in as many memories as there are virtual lanes. When 2 or more VLs are multiplexed over the same media, one bit from each memory may be transmitted in a round robin fashion, or in any order that preserves the characteristic that all VL memories associated with a media transmit one and only one bit before the second bit from the same memory is transmitted. This means that if all 20 VLs are transmitted over the same media, the serial stream transmits 1 bit associated with each virtual lane and maintains the same order of VLs over the remainder of the communication.

This last stage of interleaving creates distance between bits associated with the same virtual lane. If each virtual lane is encoded separately, this last stage of bit interleaving different virtual lanes adds burst error performance to the FEC algorithm, as compared to the same code sent serially over the same line.

Figure 7:
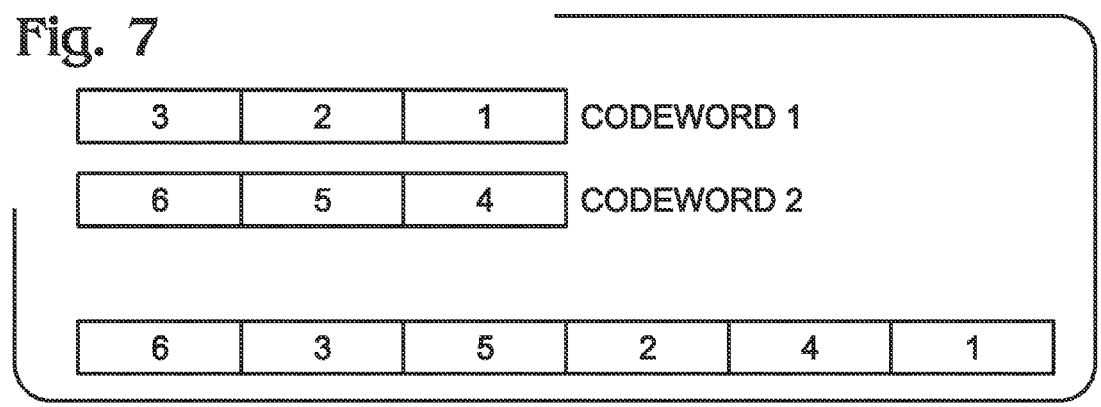
FIG. 7 is a diagram depicting the interleaving of codewords (prior art).

FIG. 7 is a diagram depicting the interleaving of codewords (prior art). If a codeword is sent without interleaving, a burst error of consecutive bits may be uncorrectable by the receiver. If codewords are interleaved, it is less likely that a burst error will affect a single particular codeword, making each codeword easier to correct.

The process of interleaving is not new to optical communications and most FEC algorithms make use of this process. Conventionally, the process of interleaving has been handled in the FEC engine. Now, with that the transmission multiplexed multiple virtual lanes over the same media, some additional interleaving outside of the FEC context.

For example, if a 10 Gbps (serial) signal incorporates an FEC code that interleaves 100 bits, a signal can be created for transmission at 100 Gbps, given the fact that 20 VLs can be bit multiplexed over the transmission line. Each virtual lane is only required to have 5 bits interleaving to withstand the same burst of bits in error. Note that the maximum burst of expected errors may increase with the speed of the signal, so for sending the signal serially at 10 times the speed, the capability of correcting bursts may have to be extended. Since the interleaving is what dictates the memory requirements and the latency associated with it, the memory required for an encoding engine at 10 G would suffice for maintaining the same burst error capability at 100 G.

When sending 4 parallel signals at 25 G, each containing a 5-bit interleave, the interleaving requirement for maintaining the same burst error capability is 20 bits, which amounts to the same memory requirements. Overall, the sequence of bits in error might be bigger with a serial signal at 100 G than on each of the 4 signals running at 25 G. Given that MLD interface must adapt to different transmission media and speeds, a tradeoff may be necessary.

Figure 8:
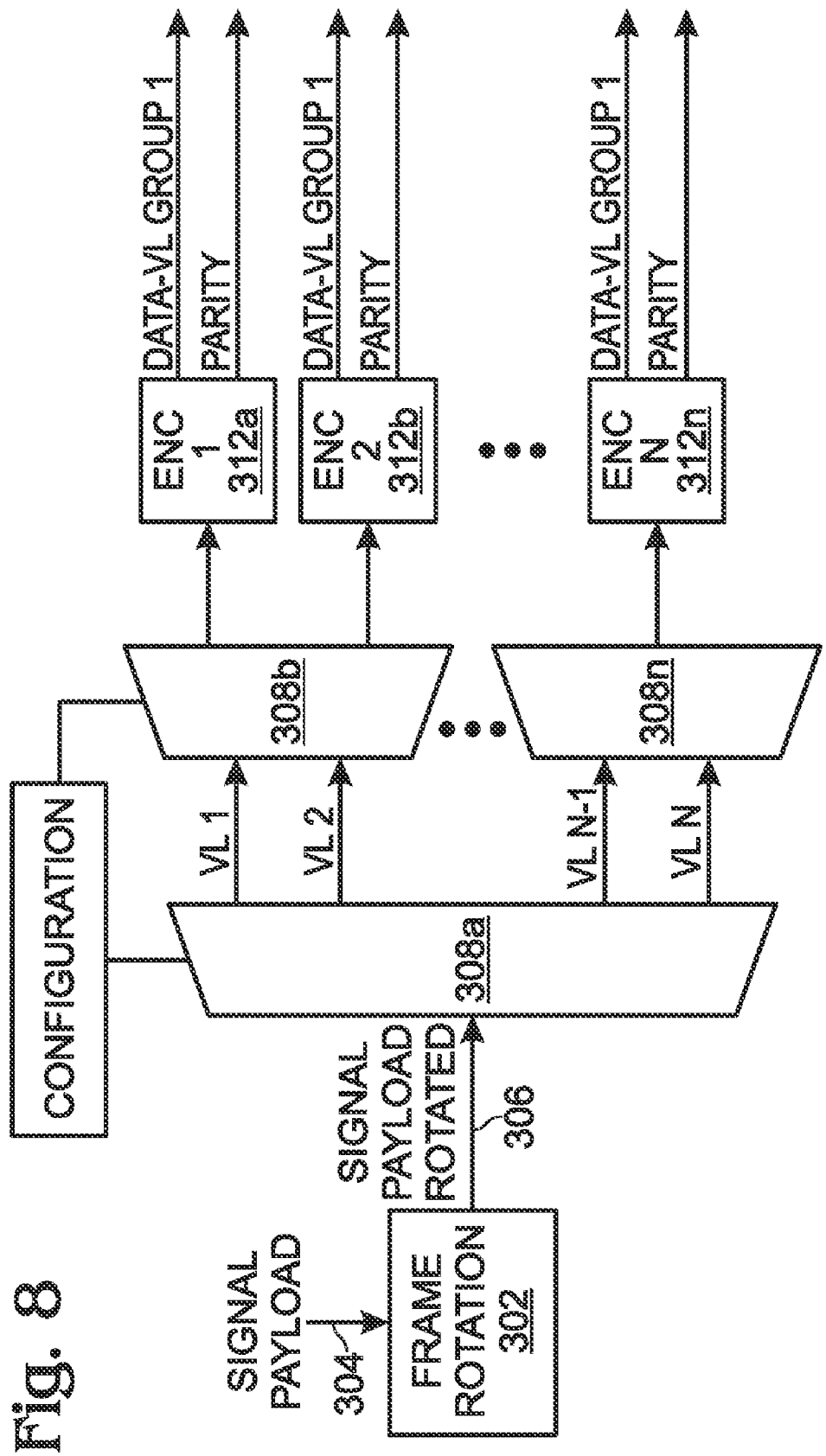
FIG. 8 is a schematic block diagram depicting a variation of the transmitter of FIG. 6.

FIG. 8 is a schematic block diagram depicting a variation of the transmitter of FIG. 6. An encoder engine can be configured to either process a single VL with interleaving equal to x, or to process the stream created with a group of 2 VLs with interleaving equal to x/2. The 2 VLs in this group are bit-multiplexed upon transmission. Therefore, the interleaving remains unchanged.

Since MLD protocol is defined for transmission over a parallel systems, e.g., 10 physical lanes, as well as into 4 or 1 physical lane, a trade off can be made against currently available technology, as true 100 G infrastructure may take years to implement.

In the case where the burst error capability is maximized for the highest possible speed of serial transmission, which requires each VL to be processed separately with maximum interleaving, an engine should be capable of reducing latency for transmission configurations that make use of a more parallel system. This is intrinsic in the engine capability of creating groups of VLs. In this configuration the latency of encoding and decoding is reduced as well as the use of memory, which in turn reduces the power requirements for these applications.

Figure 9:
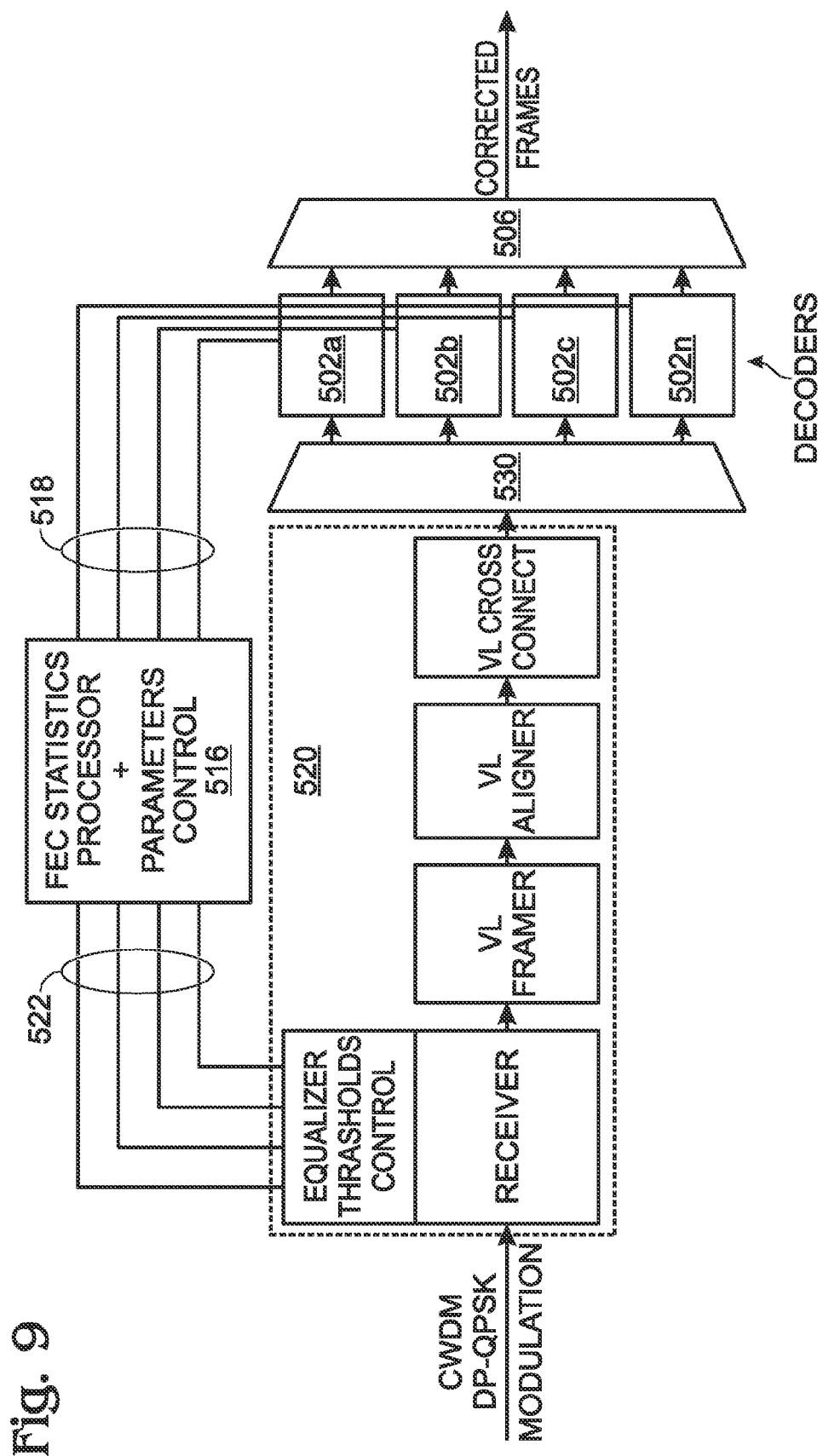
FIG. 9 is a schematic block diagram depicting a portion of the receiver system of FIG. 3 in greater detail.

FIG. 9 is a schematic block diagram depicting a portion of the receiver system of FIG. 3 in greater detail. A feedback channel is established between the FEC decoder statistics and other elements of the system. In one aspect, the parameters associated with one particular receiver may be changed while maintaining stable parameters for the other receivers. The delta in errors over a time period for the set of statistics is collected for each group or single VL. In this manner, the one group or one VL that reacts to the changes in the receiver parameters can be identified. This operation can be repeated multiple times to train the receiver parameters, and in so doing, minimize the probability of error.

FIG. 10 is a flowchart illustrating a method for generating VL FEC OH in a communication MLD protocol transmitter. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1000.

Step 1002 accepts an energy waveform representing an OTN frame with n consecutively ordered payload chunks of data words, at a first data rate. Step 1004 assigns each payload chunk to a VLDW in an MLD frame of n consecutively ordered VLDWs. Step 1006 rotates the assignment order of payload chunks to VLDWs, at the start of each MLD frame. Step 1008 joins VLDWs into a VLDW group, where each VLDW group includes at least one VLDW. Step 1010 calculates FEC blocks for VLDW groups, creating ordered VLCWs. Step 1012 multiplexes the VLCWs to maintain a consistent assignment of VLCW order to physical transmission lanes. Step 1012 transmits energy waveforms representing each VLCW in parallel via the physical transmission lanes at a combined first data rate. In one aspect, calculating FEC blocks for VLDW groups in Step 1010 includes calculating a first FEC block and a second FEC block for a VLCW including a first VLDW and a second VLDW. In another aspect, Step 1010 calculates a single FEC block for a first VLCW including a first VLDW and a second VLDW.

In a different aspect, Step 1010 creates VLCWs each having the same ratio of data word bytes to FEC block bytes. Then, transmitting each VLCW in Step 1014 includes each physical transmission lane transmitting the same ratio of data word bytes to FEC block bytes.

In another aspect, multiplexing the VLCWs to maintain a consistent assignment of VLCW order to physical transmission lanes includes multiplexing a first number of VLCWs to a second number of physical transmission lanes, less than the first number.

FIG. 11 is a flowchart illustrating a method for recovering data words from virtual lanes with FEC OH in a communication MLD protocol receiver. The method starts are Step 1100. Step 1102 receives energy waveforms representing a plurality of ordered VLCWs in parallel at a combined first data rate, via a plurality of physical transmission lanes. Each VLCW order is consistently assigned to a physical transmission lane. Step 1104 demultiplexes the VLCWs by order. Step 1106 decodes each demultiplexed VLCW into VLDW groups and associated FEC blocks, where each VLDW group includes at least one VLDW. Step 1108 forms an MLD frame of n consecutively ordered VLDWs. Step 1110 assigns each VLDW to a payload chunk of data words in an OTN frame of consecutively ordered payload chunks. Step 1112 rotates the assignment order of VLDWs to payload chunks at the start of each OTN frame. Step 1114 supplies an energy waveform representing the OTN frame at the first data rate.

In one aspect, decoding each VLCW into VLDW groups and associated FEC blocks in Step 1106 includes differentiating a first VLDW group into a first VLDW, a second VLDW, a first FEC block, and a second FEC block, associated with the first and second VLDWs, respectively. In another aspect, Step 1106 differentiates a first VLDW group into a first FEC block associated with a first VLDW and a second VLDW. In a different aspect, Step 1106 includes each VLCW having the same ratio of data words bytes to FEC block bytes.

In one aspect, receiving the plurality of VLCWs in Step 1102 includes receiving a first ordered VLCW. Then, the method includes additional steps. Step 1116 maintains a record statistics associated with the first ordered VLCW. Step 1118 distributes the statistics associated with the first ordered VLCW to communication receiver components.

In another aspect, receiving the plurality of ordered VLCWs in Step 1102 includes receiving a first number of VLCWs via a second number of physical lanes, less than the first number. Then, demultiplexing the VLCWs by order in Step 1104 includes demultiplexing into the first number VLCWs.

A system and method have been provided for generating VL FEC OH and recovering data words from virtual lanes with FEC OH. Specific circuit typologies, communication protocols, and process steps have been given to illustrate the invention. However, the invention is not limited to merely these examples. Other variations and embodiments of the invention will occur to those skilled in the art.

We claim:

1. In a communication multi-lane distribution (MLD) protocol transmitter, a method for generating virtual lane (VL) forward error correction (FEC) overhead (OH), the method comprising:
    accepting an energy waveform representing an Optical Transport Network (OTN) frame with n consecutively ordered payload chunks of data words, at a first data rate;
    assigning each payload chunk to a virtual lane data word (VLDW) in an MLD frame of n consecutively ordered VLDWs;
    rotating the assignment order of payload chunks to VLDWs, at the start of each MLD frame;
    joining VLDWs into a VLDW groups, where each VLDW group includes at least one VLDW;
    calculating FEC blocks for each VLDW group, creating ordered VL codewords (VLCWs);
    multiplexing the VLCWs to maintain a consistent assignment of VLCW order to physical transmission lanes; and,
    transmitting energy waveforms representing each VLCW in parallel via the physical transmission lanes at a combined first data rate.

2. The method of claim 1 wherein calculating FEC blocks for each VLDW group includes calculating a first FEC block and a second FEC block for a VLCW including a first VLDW and a second VLDW.

3. The method of claim 1 wherein calculating FEC blocks for each VLDW group includes calculating a single FEC block for a VLCW including a first VLDW and a second VLDW.

4. The method of claim 1 wherein calculating FEC blocks for each VLDW group includes creating VLCWs each having the same ratio of data word bytes to FEC block bytes; and,
    wherein transmitting each VLCW includes each physical transmission lane transmitting the same ratio of data word bytes to FEC block bytes.

5. The method of claim 1 wherein multiplexing the VLCWs to maintain a consistent assignment of VLCW order to physical transmission lanes includes multiplexing a first number of VLCWs to a second number of physical transmission lanes, less than the first number.

6. In a communication multi-lane distribution (MLD) protocol receiver, a method for recovering data words from virtual lanes with forward error correction (FEC) overhead (OH), the method comprising:
    receiving energy waveforms representing a plurality of ordered virtual lane codewords (VLCWs) in parallel at a combined first data rate, via a plurality of physical transmission lanes, where each VLCW order is consistently assigned to a physical transmission lane;
    demultiplexing the VLCWs by order;
    decoding each demultiplexed VLCW into VL data word (VLDW) groups and associated FEC blocks, where each VLDW group includes at least one VLDW;
    forming an MLD frame of n consecutively ordered VLDWs;
    assigning each VLDW to a payload chunk of data words in an optical transport network (OTN) frame of consecutively ordered payload chunks;
    rotating the assignment order of VLDWs to payload chunks at the start of each OTN frame; and,
    supplying an energy waveform representing the OTN frame at the first data rate.

7. The method of claim 6 wherein decoding each VLCW into VLDW groups and associated FEC blocks includes differentiating a first VLDW group into a first VLDW, a second VLDW, a first FEC block, and a second FEC block, associated with the first and second VLDWs, respectively.

8. The method of claim 6 wherein decoding each VLCW into VLDW groups and associated FEC blocks includes differentiating a first VLDW group into a first FEC block associated with a first VLDW and a second VLDW.

9. The method of claim 6 wherein receiving the plurality of VLCWs includes receiving a first ordered VLCW;
    the method further comprising:
    maintaining a record statistics associated with first ordered VLCW; and,
    distributing the statistics associated with the first ordered VLCW to communication receiver components.

10. The method of claim 6 wherein decoding each VLCW into VLDW groups and associated FEC blocks includes each VLCW having the same ratio of data words bytes to FEC block bytes.

11. The method of claim 6 wherein receiving the plurality of ordered VLCWs includes receiving a first number of VLCWs via a second number of physical lanes, less than the first number; and,
    wherein demultiplexing the VLCWs by order includes demultiplexing into the first number VLCWs.

12. A multi-lane distribution (MLD) protocol transmitter with a system for generating virtual lane (VL) forward error correction (FEC) overhead (OH), the system comprising:
    a rotation mapper having an interface to accept an energy waveform representing an Optical Transport Network (OTN) frame with n consecutively ordered payload chunks of data words, at a first data rate, the mapper assigning each payload chunk to a virtual lane data word (VLDW) in an MLD frame of n consecutively ordered VLDWs, and rotating the assignment order of payload chunks to VLDWs at the start of each MLD frame;

a multiplexer (MUX) having an input to accept the MLD frame and a plurality of outputs to supply VLDW groups, where each VLDW group includes at least one VLDW; and, a plurality of encoders having inputs connected to the MUX to accept the VLDW groups, the encoders calculating forward error correction (FEC) blocks for the VLDW groups, joining VLDW groups and their associated FEC blocks into an ordered VL codeword (VLCW), where each order is associated with a corresponding encoder;

a crossbar switch having a plurality of inputs connected to the encoder outputs, the crossbar switch selectively connecting the VLCWs to outputs to maintain a consistent assignment of VLCW order to physical transmission lanes; and, a plurality of transmitters, one for each physical transmission lane, the plurality of transmitters transmitting energy waveforms representing the VLCWs in parallel at a combined first data rate.

13. The system of claim 12 wherein a first encoder calculates a first FEC block and a second FEC block for a VLCW including a first VLDW and a second VLDW.

14. The system of claim 12 wherein a first encoder calculates a single FEC block for a first VLCW including a first VLDW and a second VLDW.

15. The system of claim 12 wherein the encoders create VLCWs each having the same ratio of data word bytes to FEC block bytes, and, wherein each transmitter transmits the same ratio of data word bytes to FEC block bytes.

16. The system of claim 12 wherein the crossbar switch has a first number of inputs connected to a first number of encoder outputs, and a second number of outputs connected to a second number of physical lanes, less than the first number.

17. A multi-lane distribution (MLD) protocol receiver with a system for recovering data words from virtual lanes with forward error correction (FEC) overhead (OH), the system comprising:

a crossbar switch having inputs connected to a plurality of physical transmission lane interfaces for receiving energy waveforms representing a plurality of ordered virtual lane codewords (VLCW) in parallel at a combined first data rate, where each VLCW order is consistently assigned to a physical transmission lane, the crossbar switch having a plurality of outputs;

a plurality of decoders having inputs connected to the crossbar switch outputs, where each decoder is associated with a corresponding VLCW order, each decoder differentiating a VLCW into VL data word (VLDW) groups and associated forward error correction (FEC) blocks, where each VLDW group includes at least one VLDW;

a demultiplexer (DEMUX) having a plurality of inputs to receive VLDWs from the decoders, and an output to supply an MLD frame of n consecutively ordered VLDWs;

a rotation demapper having an input to accept the MLD frame, the rotation demapper assigning each VLDW to a payload chunk of data words in an OTN frame of consecutively ordered payload chunks, rotating the assignment order of VLDWs to payload chunks at the start of each OTN frame, and supplying an energy waveform representing the OTN frame at the first data rate.

18. The system of claim 17 wherein a first decoder differentiates a first VLDW group into a first VLDW, a second VLDW, where a first FEC block is associated with the first VLDW, and a second FEC block is associated with the second VLDW.

19. The system of claim 17 wherein a first decoder differentiates a first VLDW group into a first VLDW and a second VLDW, where a first FEC block is associated with both the first and second VLDWs.

20. The system of claim 17 wherein the crossbar switch receives a first order VLCW and a second order VLCW via a first physical transmission lane, and supplies the first order VLCW to a first decoder and the second order VLCW to a second decoder.

21. The system of claim 17 wherein the crossbar switch receives a first ordered VLCW;

the system further comprising:

an FEC correction unit having an input to receive FEC blocks from the first ordered VLCW, the FEC correction unit maintaining a record of statistics associated with the first ordered VLCW, and distributing the statistics associated with the first ordered VLCW to communication receiver components.

22. The system of claim 17 wherein the decoder demapper differentiates VLCWs, each having the same ratio of data words bytes to FEC block bytes.

* * * * *